United States Patent
Yanagisawa

(10) Patent No.: US 10,950,726 B2
(45) Date of Patent: Mar. 16, 2021

(54) SEMICONDUCTOR DEVICE, CMOS CIRCUIT, AND ELECTRONIC APPARATUS WITH STRESS IN CHANNEL REGION

(71) Applicant: SONY CORPORATION, Tokyo (JP)

(72) Inventor: Yuki Yanagisawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 97 days.

(21) Appl. No.: 16/094,403

(22) PCT Filed: Mar. 16, 2017

(86) PCT No.: PCT/JP2017/010716
§ 371 (c)(1),
(2) Date: Oct. 17, 2018

(87) PCT Pub. No.: WO2017/187831
PCT Pub. Date: Nov. 2, 2017

(65) Prior Publication Data
US 2019/0131455 A1 May 2, 2019

(30) Foreign Application Priority Data

Apr. 25, 2016 (JP) ............................. JP2016-087099

(51) Int. Cl.
*H01L 29/78* (2006.01)
*H01L 27/12* (2006.01)
(Continued)

(52) U.S. Cl.
CPC ........ *H01L 29/7849* (2013.01); *H01L 21/324* (2013.01); *H01L 21/3247* (2013.01);
(Continued)

(58) Field of Classification Search
CPC . H01L 29/7849; H01L 27/12; H01L 29/0649; H01L 21/324; H01L 21/3247;
(Continued)

(56) References Cited

U.S. PATENT DOCUMENTS

2005/0176222 A1   8/2005  Ogura
2005/0189589 A1*  9/2005  Zhu ................... H01L 29/78603
                                                      257/347

(Continued)

FOREIGN PATENT DOCUMENTS

AU    2003235902 A1    11/2003
CN        1669148 A     9/2005
(Continued)

OTHER PUBLICATIONS

International Search Report and Written Opinion of PCT Application No. PCT/JP2017/010716, dated Jun. 6, 2017, 11 pages of ISRWO.

*Primary Examiner* — John P. Dulka
(74) *Attorney, Agent, or Firm* — Chip Law Group

(57) ABSTRACT

The semiconductor device according to the present technology includes a hollow region or an insulating region. The hollow region or the insulating region is provided under a channel that is formed between a source of a first semiconductor type and a drain of the first semiconductor type in a body region of a second semiconductor type in a transistor, the body region being provided between the source and the drain.

15 Claims, 18 Drawing Sheets

(51) Int. Cl.

| | | |
|---|---|---|
| *H01L 29/06* | (2006.01) | |
| *H01L 21/324* | (2006.01) | |
| *H01L 29/786* | (2006.01) | |
| *H01L 29/08* | (2006.01) | |
| *H01L 29/10* | (2006.01) | |
| *H01L 29/66* | (2006.01) | |
| H01L 21/8238 | (2006.01) | |
| H01L 27/092 | (2006.01) | |
| H01L 21/762 | (2006.01) | |
| H01L 21/265 | (2006.01) | |
| H01L 21/266 | (2006.01) | |
| H01L 21/3065 | (2006.01) | |
| H01L 21/311 | (2006.01) | |

(52) U.S. Cl.
CPC .......... *H01L 27/12* (2013.01); *H01L 29/0649* (2013.01); *H01L 29/0847* (2013.01); *H01L 29/1033* (2013.01); *H01L 29/66568* (2013.01); *H01L 29/786* (2013.01); *H01L 29/7833* (2013.01); *H01L 29/7843* (2013.01); *H01L 21/266* (2013.01); *H01L 21/26533* (2013.01); *H01L 21/3065* (2013.01); *H01L 21/31111* (2013.01); *H01L 21/31116* (2013.01); *H01L 21/76243* (2013.01); *H01L 21/823807* (2013.01); *H01L 27/092* (2013.01); *H01L 29/665* (2013.01)

(58) Field of Classification Search
CPC ............... H01L 29/786; H01L 29/0847; H01L 29/1033; H01L 29/66568
See application file for complete search history.

(56) References Cited

U.S. PATENT DOCUMENTS

| | | | |
|---|---|---|---|
| 2008/0142855 A1 | 6/2008 | Ikeda et al. | |
| 2013/0137235 A1* | 5/2013 | Yu ...................... | H01L 29/7849 438/294 |

FOREIGN PATENT DOCUMENTS

| | | | |
|---|---|---|---|
| EP | 1513198 A1 | 3/2005 | |
| JP | 2003-332540 A | 11/2003 | |
| JP | 2008-053638 A | 3/2008 | |
| JP | 2011-199112 A | 10/2011 | |
| KR | 10-2004-0102223 A | 12/2004 | |
| WO | 03/096426 A1 | 11/2003 | |

* cited by examiner

PRIOR ART

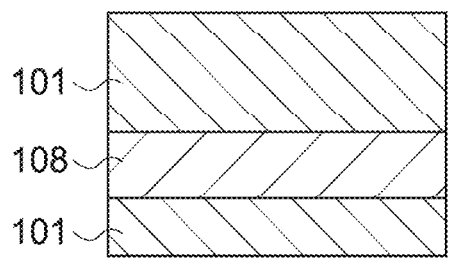
FIG. 15A
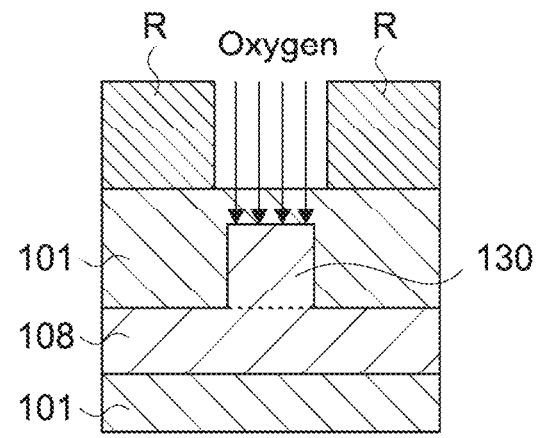
FIG. 15B
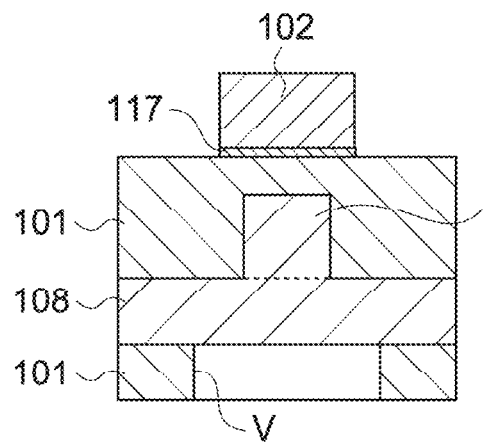
FIG. 15C
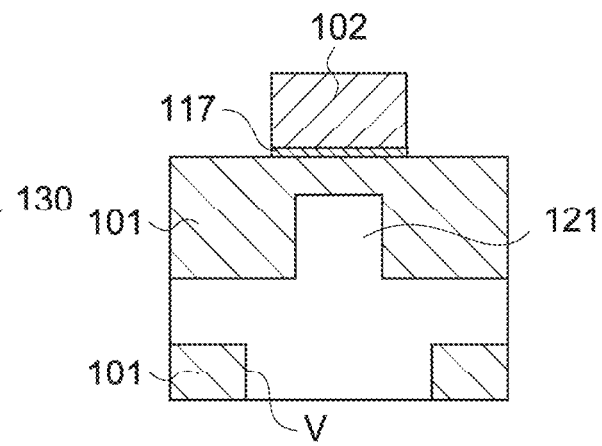
FIG. 15D
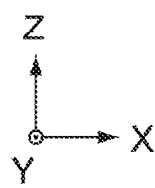

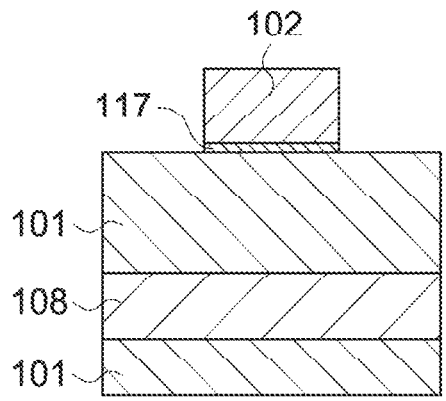
FIG. 19A
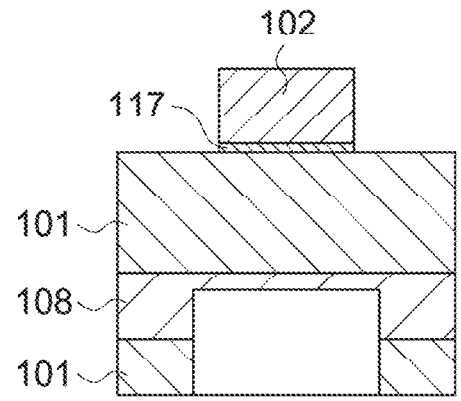
FIG. 19B
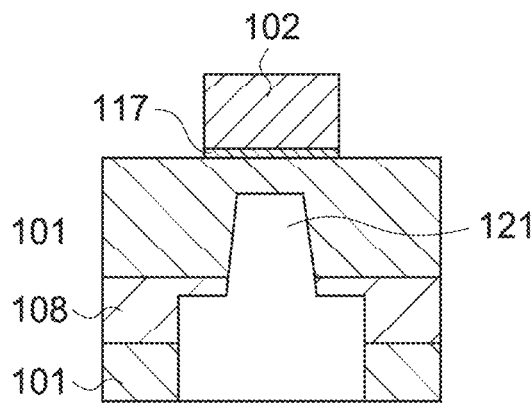
FIG. 19C
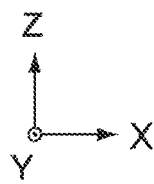

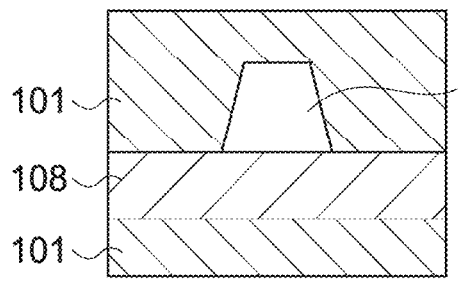
FIG. 20A
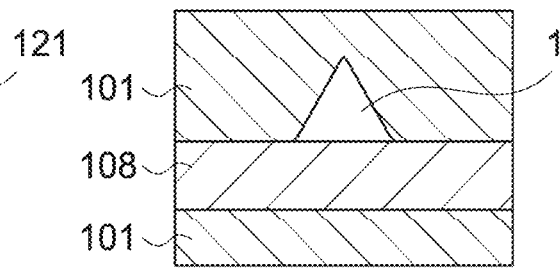
FIG. 20B
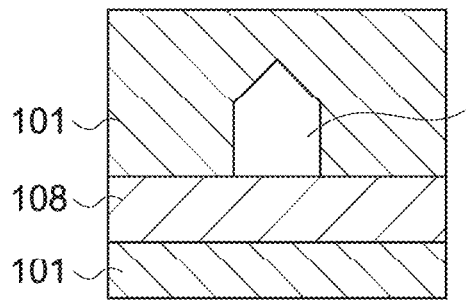
FIG. 20C
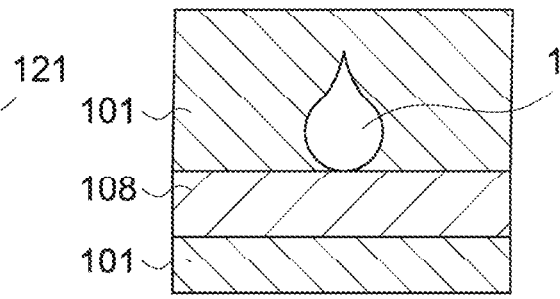
FIG. 20D
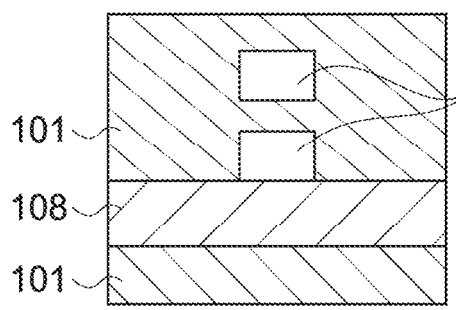
FIG. 20E
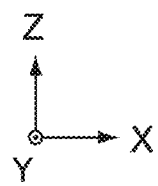

SEMICONDUCTOR DEVICE, CMOS CIRCUIT, AND ELECTRONIC APPARATUS WITH STRESS IN CHANNEL REGION

CROSS REFERENCE TO RELATED APPLICATIONS

This application is a U.S. National Phase of International Patent Application No. PCT/JP2017/010716 filed on Mar. 16, 2017, which claims priority benefit of Japanese Patent Application No. JP 2016-087099 filed in the Japan Patent Office on Apr. 25, 2016. Each of the above-referenced applications is hereby incorporated herein by reference in its entirety.

TECHNICAL FIELD

The present technology relates to a semiconductor device having a transistor structure, a CMOS circuit, and an electronic apparatus.

BACKGROUND ART

There have been demands for reduction of an ON resistance ($R_{on}$) that is a resistance between a source and a drain under an ON state in transistors. There is a report that the ON resistance can be reduced by increasing carrier mobility through application of stress to a channel in the transistor, and that the carrier mobility becomes higher as a value of the stress increases (Reference Literature: IEEE ELECTRON DEVICE LETTERS, VOL. 28, NO. 1, January 2007).

In N-type transistors, the carrier mobility can be increased by applying tensil film stress to the channel. In P-type transistors, hole mobility can be increased by applying compressive film stress to the channel.

For example, Patent Literature 1 discloses a semiconductor device having a transistor structure in which the carrier mobility is increased by applying stress to the channel through utilization of a stress liner film having film stress. The stress liner film is made of materials that generate the film stress, such as SiN, and is formed over a gate and a silicon layer in which the source and the drain are formed.

CITATION LIST

Patent Literature

Patent Literature 1: Japanese Patent Application Laid-open No. 2011-199112

Disclosure of Invention

Technical Problem

However, when the stress liner film is formed over the gate and the silicon layer, the stress concentrates on end portions of the channel and decreases toward a central portion of the channel. Thus, the stress cannot be transmitted to the entirety of the channel, and the advantage of increasing the carrier mobility cannot be sufficiently obtained.

Meanwhile, when the thickness of the silicon layer is reduced, the stress that is applied to the channel can be increased. However, when the thickness of the silicon layer is reduced, a sheet resistance in the silicon layer increases (Reference Literature: OKI Technical Review, October, 2000, Issue 184, Vol. 67, No. 3). As a result, there arise problems that the advantage of reducing the ON resistance cannot be obtained, and that an OFF capacitance (parasitic capacitance under an OFF state) increases. For those reasons, there have been demands for a transistor structure that is low in ON resistance and OFF capacitance, and is excellent in electric characteristics.

In view of such circumstances, the present technology has been made to achieve an objective to provide a semiconductor device, a CMOS circuit, and an electronic apparatus excellent in electric characteristics.

In order to achieve the above-mentioned objective, according to an embodiment of the present technology, there is provided a semiconductor device including a hollow region or an insulating region.

The hollow region or the insulating region is provided under a channel that is formed between a source of a first semiconductor type and a drain of the first semiconductor type in a body region of a second semiconductor type in a transistor, the body region being provided between the source and the drain.

In this configuration, owing to the provision of the hollow region or the insulating region in the body region, a volume of the body region can be reduced. As a result, an OFF capacitance can be reduced. Further, when film stress is applied to the channel, the hollow region or the insulating region causes the film stress to concentrate on the channel. Thus, the carrier mobility in the channel is increased. As a result, an ON resistance can be reduced. In other words, in the above-mentioned configuration, both the OFF capacitance and the ON resistance can be reduced, and hence a semiconductor device excellent in electric characteristics can be provided.

The semiconductor device may further include a stress liner film that applies the film stress to the channel.

The film stress can be applied to the channel by the stress liner film.

The semiconductor device may further include: a gate insulating film; a gate that faces the body region through intermediation of the gate insulating film; and side walls adjacent to the gate.

A width in a first direction parallel to a channel length of an end portion on the channel side of the hollow region or the insulating region may be smaller than a sum of a gate length and widths in the first direction of the side walls.

The film stress that is applied to the channel becomes higher as the width of the end portion on the channel side of the hollow region or the insulating region becomes smaller. Thus, the width of this end portion is preferably smaller than the sum of the gate length and the widths of the side walls.

The width in the first direction of the end portion on the channel side of the hollow region or the insulating region may be smaller than the gate length.

The width of the end portion on the channel side of the hollow region or the insulating region is more preferably smaller than the gate length.

A width in the first direction of an end portion on a side opposite to the channel side of the hollow region or the insulating region may be larger than the gate length.

As a volume of the hollow region or the insulating region becomes higher, depletion under an OFF state is promoted, and the OFF capacitance becomes lower. Although the width of the end portion on the channel side of the hollow region or the insulating region is preferably small as described above, by increasing the width of the end portion on the side opposite to the channel side, the volume of the hollow region or the insulating region can be increased.

The hollow region or the insulating region may be formed such that a thickness of a part of the body region, the part being thinned by the hollow region or the insulating region, is 10 nm or more and 120 nm or less.

In order that the film stress that is applied to the channel is increased, the thickness of the part of the body region, the part being thinned by the hollow region or the insulating region, is preferably small. However, the channel is formed in the thinned part of the body region, and hence the thickness of the body region needs to be set not to hinder carrier movement through the channel. A thickness of the channel is less than 10 nm, and hence the thickness of the thinned body region is preferably 10 nm or more. Further, when the thickness of the thinned body region is more than 120 nm, an advantage that the film stress that is applied to the channel is increased by the hollow region or the insulating region is reduced. Thus, the thickness of the thinned body region is preferably 120 nm or less.

The hollow region or the insulating region may have a volume at which the body region is fully depleted under a state in which the transistor is turned off.

When the volume of the hollow region or the insulating region is set such that the body region is fully depleted under the state in which the transistor is turned off, the OFF capacitance can be reduced.

The semiconductor device may be an NMOS (N-type Metal Oxide Semiconductor) in which the first semiconductor type is an N-type and the second semiconductor type is a P-type.

The stress liner film may apply tensile film stress to the channel.

When the semiconductor device is the NMOS, and the channel is a semiconductor region of the N-type, by applying the tensile film stress to the channel, electron mobility can be increased.

The semiconductor device may be a PMOS (P-type Metal Oxide Semiconductor) in which the first semiconductor type is the P-type and the second semiconductor type is the N-type.

The stress liner film may apply compressive film stress to the channel.

When the semiconductor device is the PMOS, and the channel is a semiconductor region of the P-type, by applying the tensile film stress to the channel, the hole mobility can be increased.

The semiconductor device may have an SOI structure, or an SoN structure.

The semiconductor device may be a MOSFET (Metal Oxide Semiconductor Field Effect Transistor).

The stress liner film may be made of silicon nitride, and the insulating region may be made of silicon oxide.

In the semiconductor device according to claim 1, the insulating region may apply the film stress to the channel.

The channel film stress may be applied by the insulating region, or the film stress may be applied to the channel by both the insulating region and the stress liner film.

In order to achieve the above-mentioned object, according to another embodiment of the present technology, there is provided a CMOS (Complementary MOS) circuit including a semiconductor device including a hollow region or an insulating region.

The hollow region or the insulating region is provided under a channel that is formed between a source of a first semiconductor type and a drain of the first semiconductor type in a body region of a second semiconductor type in a transistor, the body region being provided between the source and the drain.

In order to achieve the above-mentioned object, according to still another embodiment of the present technology, there is provided an electronic apparatus including a semiconductor device including a hollow region or an insulating region.

The hollow region or the insulating region is provided under a channel that is formed between a source of a first semiconductor type and a drain of the first semiconductor type in a body region of a second semiconductor type in a transistor, the body region being provided between the source and the drain.

Advantageous Effects of Invention

As described above, according to the present technology, the semiconductor device, the CMOS circuit, and the electronic apparatus excellent in electric characteristics can be provided. Note that, the advantages disclosed herein are not necessarily limited to those described hereinabove, and all the advantages described hereinabove and hereinbelow can be obtained.

BRIEF DESCRIPTION OF DRAWINGS

FIGS. 15A, 15B, 15C, and 15D Schematic views illustrating a first manufacturing method for the semiconductor device.

FIGS. 19A, 19B, and 19C Schematic views illustrating a third manufacturing method for the semiconductor device.

FIGS. 20A, 20B, 20C, 20D, and 20E Schematic views illustrating various shapes of the hollow region provided in the semiconductor device.

MODE(S) FOR CARRYING OUT THE INVENTION

A semiconductor device according to this embodiment is described.

[Configuration of Semiconductor Device]

Figure 1:
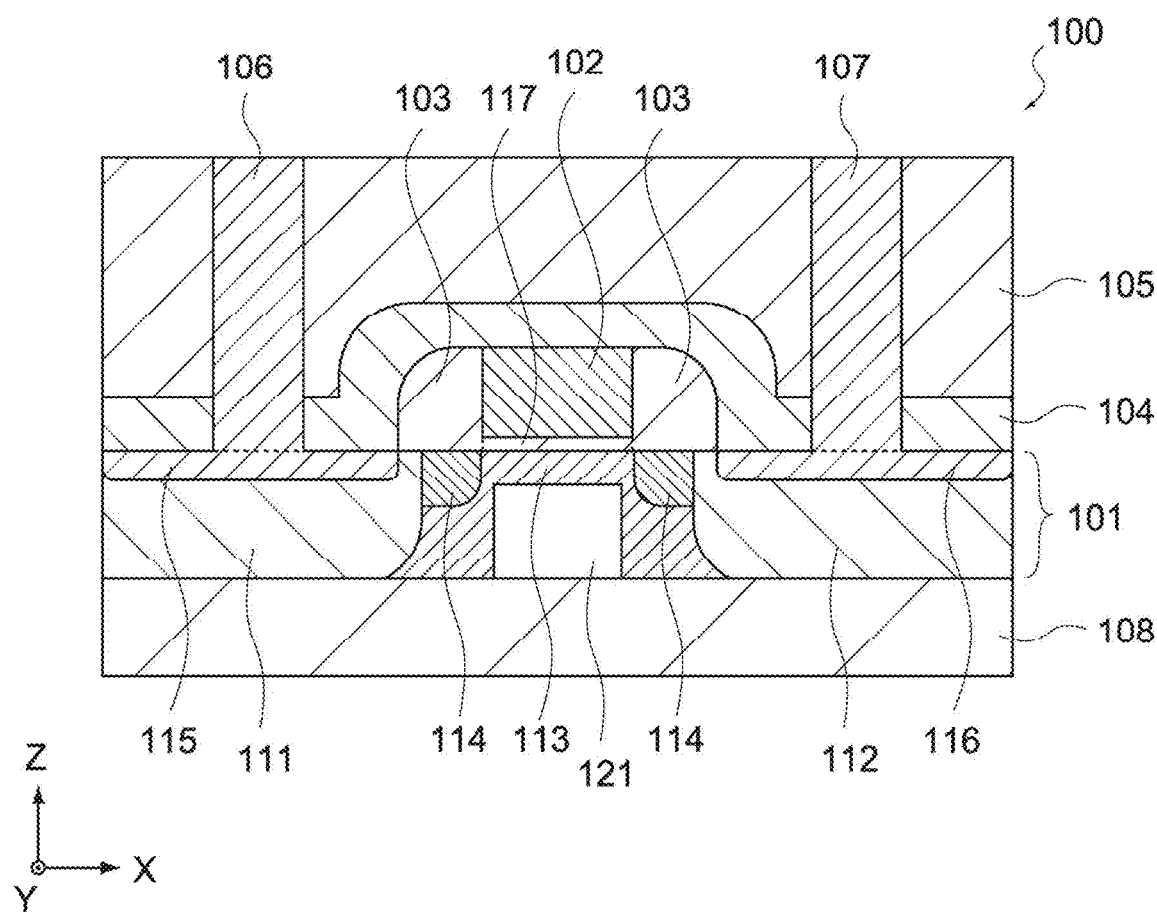
FIG. 1 A cross-sectional view of a semiconductor device according to an embodiment of the present technology.

FIG. 1 is a cross-sectional view illustrating a configuration of a semiconductor device 100 according to this embodiment. As illustrated in FIG. 1, the semiconductor device 100 includes a silicon layer 101, a gate 102, side walls 103, a stress liner film 104, an interlayer insulating film 105, a source contact 106, a drain contact 107, and a BOX layer 108. With this, the semiconductor device 100 constitutes a transistor.

Note that, three directions orthogonal to each other in the subsequent drawings are respectively referred to as an X-direction, a Y-direction, and a Z-direction. The X-direction corresponds to a direction of a channel length of the transistor, and the Y-direction corresponds to a direction of a channel width.

The semiconductor device 100 may be a MOSFET (Metal Oxide Semiconductor Field Effect Transistor) having a MOS (Metal Oxide Semiconductor) structure. The MOS may be an NMOS in which an N-type channel is formed, or a PMOS in which a P-type channel is formed. Further, the semiconductor device 100 is not limited to the MOSFET, and may constitute transistors having various structures. Description hereinbelow is made by way of an example of the NMOS.

The silicon layer 101 is a layer made of silicon (Si). A source 111 and a drain 112 are provided in the silicon layer 101. The source 111 and the drain 112 are regions formed by doping an N-type dopant such as phosphorus (P) or arsenic (As) into the silicon forming the silicon layer 101.

As illustrated in FIG. 1, the source 111 and the drain 112 are separated from each other. Between the source 111 and the drain 112, there is provided a body region 113 doped with a P-type dopant such as boron (B) or aluminum (Al).

Between the source 111 and the body region 113 and between the drain 112 and the body region 113, there are provided LDDs (Lightly Doped Drains) 114 formed by doping the n-type dopant at a density lower than those in the source 111 and the drain 112. Note that, the LDDs 114, which are layers that reduce field crowding between the body region 113 and each of the source 111 and the drain 112, need not necessarily be provided.

When the semiconductor device 100 is the PMOS, the source 111, the drain 112, and the LDDs 114 may be regions doped with the P-type dopant, and the body region 113 may be a region doped with the N-type dopant.

In the silicon layer 101, a channel is formed between the source 111 and the drain 112. In the body region 113, a hollow region 121 is provided under the channel. Details of these parts are described below.

A source connecting layer 115 is provided on a surface side of the source 111. The source connecting layer 115, which is a layer for reducing a resistance between the source contact 106 and the source 111, is made of metal silicides such as cobalt silicide (CoSi). The source connecting layer 115 can be formed by forming a film of metals such as cobalt on the silicon layer 101, and diffusing the metal throughout the silicon by, for example, heating.

A drain connecting layer 116 is provided on a surface side of the drain 112. The drain connecting layer 116, which is a layer for reducing a resistance between the drain contact 107 and the drain 112, is made of the metal silicides such as cobalt silicide (CoSi). The drain connecting layer 116 can be formed by forming the film of the metals such as cobalt on the silicon layer 101, and diffusing the metal throughout the silicon by, for example, heating.

The gate 102 is provided on the silicon layer 101 through intermediation of a gate insulating film 117, and faces the body region 113 through intermediation of the gate insulating film 117. The gate 102 is made of a conductive material such as tungsten (W) or polycrystalline silicon. The gate insulating film 117, which is a layer that insulates the silicon layer 101 and the gate 102 from each other, is made of insulating materials such as silicon dioxide ($SiO_2$). In the following, a length of the gate 102 along the X-direction is defined as a gate length, and a width of the same along the Y-direction is defined as a gate width.

The side walls 103, which are provided adjacent to the gate 102, are made of the insulating materials such as $SiO_2$. The side walls 103 are utilized as etching masks at a time of forming the metal silicide constituting the source connecting layer 115 and the drain connecting layer 116.

The stress liner film 104 is made of materials having film stress, such as silicon nitride (SiN), and is formed over the silicon layer 101, the gate 102, and the side walls 103. With this, stress is applied to the channel as described below.

The stress liner film 104 can be formed by PVD (Physical Vapor Deposition) or CVD (chemical vapor deposition). The film stress of the stress liner film 104 can be adjusted by a forming method and a thickness of the stress liner film 104. Note that, the stress liner film 104 may double as an etching stopper for the source contact 106 and the drain contact 107.

The interlayer insulating film 105 is made of the insulating material, and is laminated on the stress liner film 104. Examples of the insulating materials of the interlayer insulating film 105 include $SiO_2$. With this, the transistor is insulated.

The source contact 106 is connected to the source connecting layer 115 so as to be electrically connected to the source 111 via the source connecting layer 115. The source contact 106 is made of the conductive materials such as cobalt.

The drain contact 107 is connected to the drain connecting layer 116 so as to be electrically connected to the drain 112 via the drain connecting layer 116. The drain contact 107 is made of the conductive materials such as cobalt.

The BOX (Buried OXide) layer 108, which is a layer formed in a silicon substrate, is made of $SiO_2$. By providing the BOX layer 108, parasitic capacitance of the transistor can be reduced. The silicon substrate in which the BOX layer is provided is called an SOI (silicon on insulator) substrate, and a semiconductor device formed on the SOI substrate has an SOI structure.

Note that, the BOX layer 108 need not necessarily be provided. Further, a space may be provided instead of the BOX layer 108. Such a substrate is called a SoN (silicon on nothing) substrate, and a semiconductor device formed on the SoN substrate has a SoN structure.

[Operation of Semiconductor Device]

Now, operation of the semiconductor device 100 is described.

Figure 2:
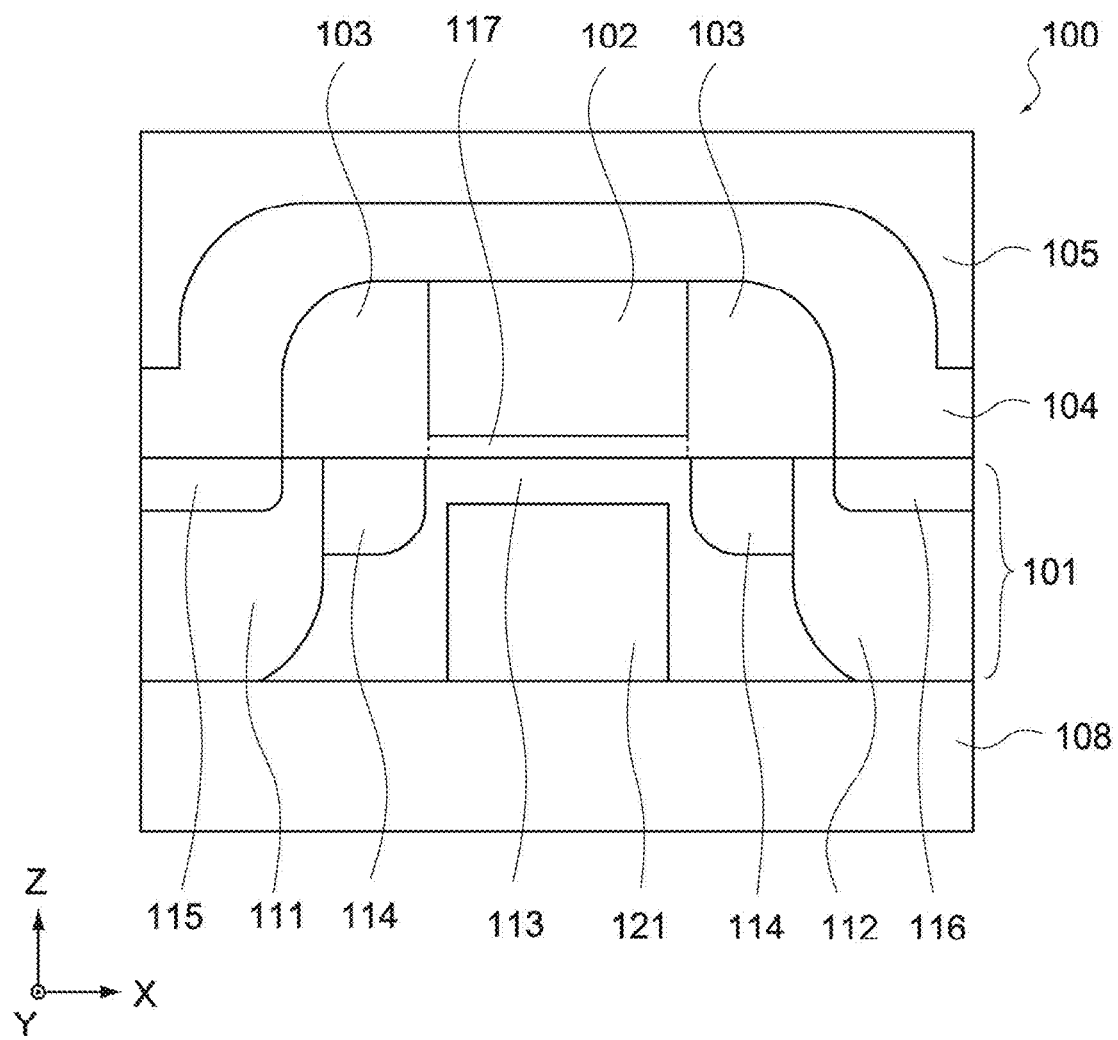
FIG. 2 A schematic view illustrating an operation of the semiconductor device.
Figure 3:
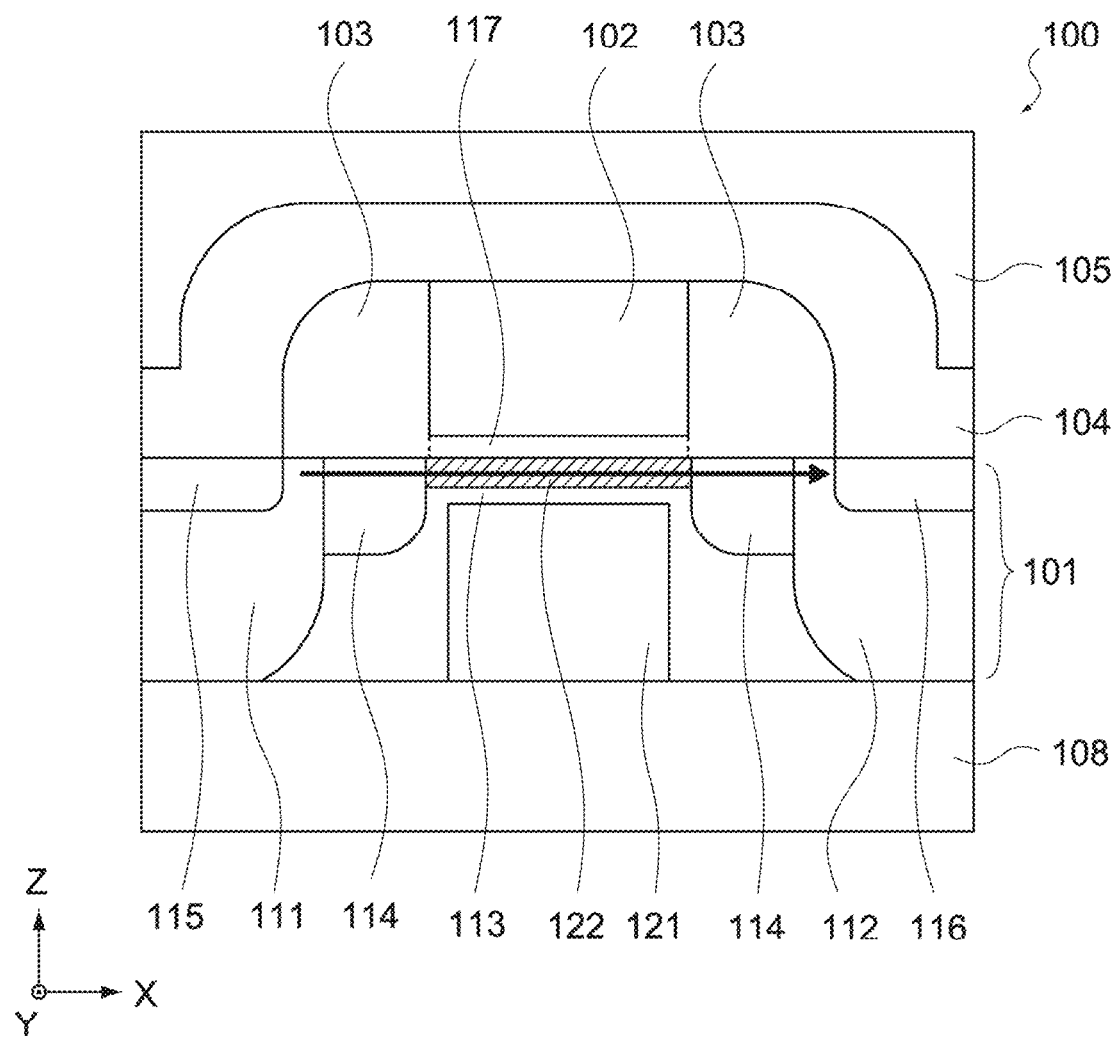
FIG. 3 Another schematic view illustrating the operation of the semiconductor device.

FIG. 2 and FIG. 3 are each a schematic view illustrating the operation of the semiconductor device 100. As illustrated in FIG. 2, the body region 113 being a P-type semiconductor is provided between the source 111 and the drain 112 each being an N-type semiconductor. Thus, under a state in which voltage is not applied between the gate 102 and the source 111, current does not flow between the source 111 and the drain 112 (OFF state).

When voltage is applied between the gate 102 and the source 111, in the body region 113, holes move to a side opposite to the gate 102, and electrons move to the gate 102 side. With this, as illustrated in FIG. 3, a channel 122 being the N-type semiconductor is formed at a part of the silicon layer 101, which faces the gate 102.

When voltage is applied between the source 111 and the drain 112 in this state, current flows (indicated by an arrow in FIG. 3) from the source 111 to the drain 112 through the channel 122 (ON state).

Note that, in a case where the semiconductor device 100 is a P-type transistor, when voltage is applied between the gate 102 and the source 111, the holes move to the gate 102 side. The channel 122 to be formed in this case is a P-type semiconductor.

[Stress Liner Film]

Figure 4:
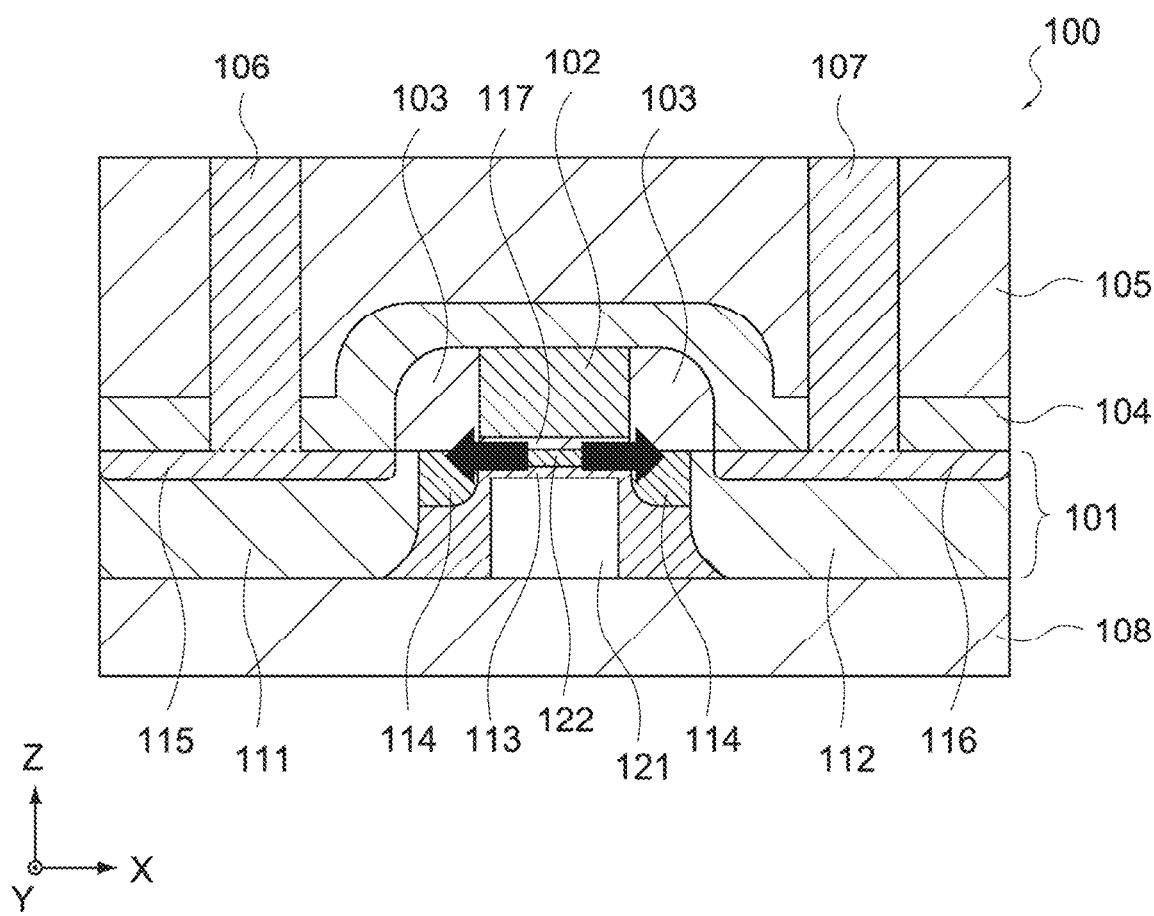
FIG. 4 A schematic view illustrating film stress that is applied to a channel in the semiconductor device.

As described above, the semiconductor device 100 includes the stress liner film 104, and the stress liner film 104 applies the film stress to the channel 122. FIG. 4 is a schematic view illustrating the stress that is applied to the channel 122 by the stress liner film 104. As illustrated in FIG. 4, the stress liner film 104 applies tensil film stress to the channel 122.

When the stress liner film 104 applies the film stress to the channel 122, electron mobility in the channel 122 is increased. Note that, a structure of the semiconductor device 100 is not particularly limited as long as the film stress is applied to the channel 122. The semiconductor device 100 may have another structure in which the film stress to the channel 122 may be applied by a component other than the stress liner film 104.

Note that, the film stress illustrated in FIG. 4 is applied in the case where the semiconductor device 100 is the NMOS. In the case where the semiconductor device 100 is the PMOS, when compressive film stress opposite to that in FIG. 4 is applied to the channel 122, hole mobility can be increased.

[Hollow Region]

Figure 5:
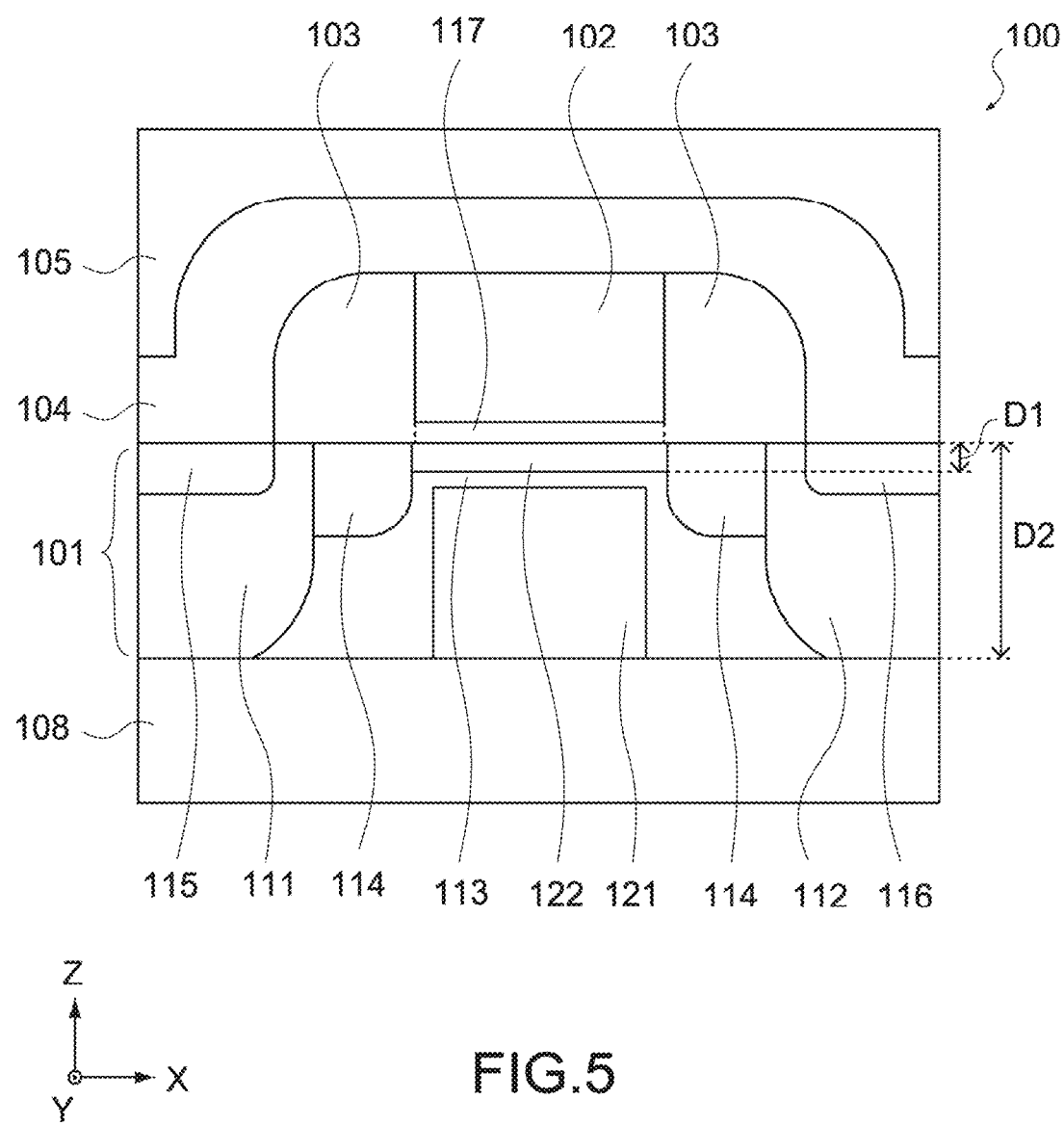
FIG. 5 A schematic view of a hollow region provided in the semiconductor device.

As described above, the hollow region 121 is provided under the channel 122 in the body region 113. FIG. 5 is a schematic view illustrating the hollow region 121.

An upper end portion (end portion on the gate 102 side) of the hollow region 121 is provided at a position that does not hinder the carrier movement through the channel 122. As illustrated in FIG. 5, when a depth of the channel 122 from a surface of the silicon layer 101 is defined as a depth D1, the upper end portion of the hollow region 121 is provided at a position deeper than the depth D1.

A lower end portion (end portion on the BOX layer 108 side) of the hollow region 121 may be adjacent to the BOX layer 108, or separated from the BOX layer 108. When a depth of the source 111 and the drain 112 from the surface of the silicon layer 101 is defined as a depth D2, the lower end portion of the hollow region 121 is provided preferably at a position equivalent to the depth D2, or at a position shallower than the depth D2.

Further, when the silicon substrate is the SoN substrate, the hollow region 121 may communicate with the space that is provided instead of the BOX layer 108.

[Advantages to Be Obtained by Hollow Region]

Advantages to be obtained by the hollow region 121 are described by way of comparison with a comparative example.

Figure 6:
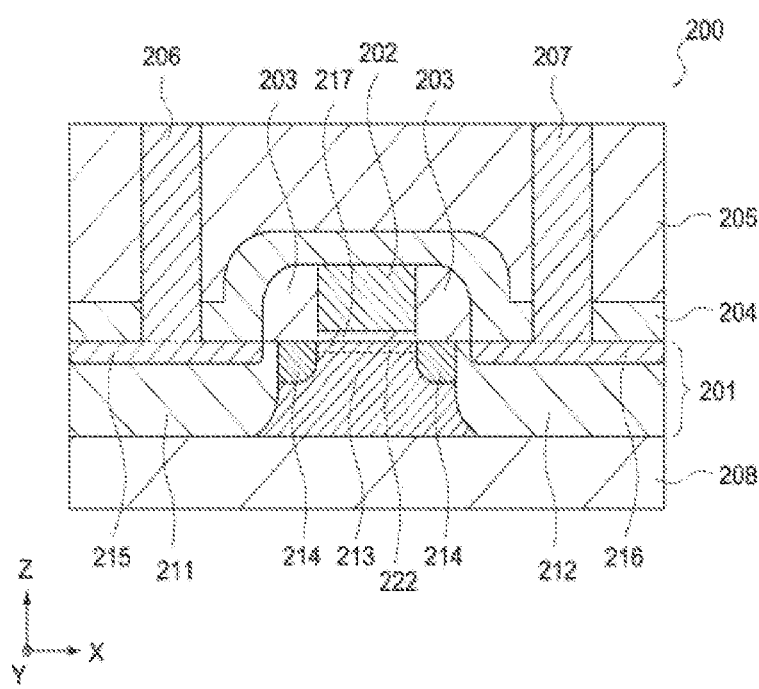
FIG. 6 A cross-sectional view of a semiconductor device according to a comparative example.

FIG. 6 is a schematic view of a semiconductor device 200 according to the comparative example. As illustrated in FIG. 6, the semiconductor device 200 includes a silicon layer 201, a gate 202, side walls 203, a stress liner film 204, an interlayer insulating film 205, a source contact 206, a drain contact 207, and a BOX layer 208.

In the silicon layer 201, a source 211, a drain 212, a body region 213, lightly doped drains 214, a source connecting layer 215, and a drain connecting layer 216 are provided. The gate 202 faces the body region 213 through intermediation of a gate insulating film 217. Under the ON state, a channel 222 is formed between the source 211 and the drain 212.

The semiconductor device 200 is different from the semiconductor device 100 according to this embodiment in that the hollow region is not provided through the body region 213.

Figure 7:
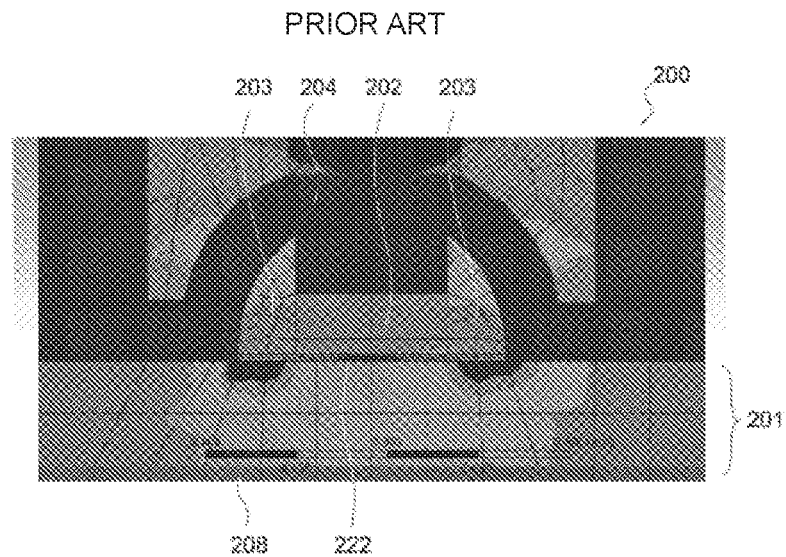
FIG. 7 A result of a simulation of stress in the semiconductor device.

FIG. 7 shows a result of a stress simulation with respect to the semiconductor device 200 having the above-described configuration, that is, visualization of a maximum principal-stress distribution. Magnitudes of the stress and color depths of regions where the stress is applied are proportionate to each other. In this simulation, stress in a MOSTr was calculated, and a thickness of the silicon layer 201 was set to 170 nm.

As shown in FIG. 7, the stress by the stress liner film 204 is applied mainly to parts of the silicon layer 201, which are directly under the side walls 203, and decreases toward a central portion of the channel 222. Thus, the stress is not sufficiently applied to an entirety of the channel 222, and hence the advantage of increasing the carrier mobility is reduced.

Thus, an advantage of reducing an ON resistance by the stress liner film 204 is also reduced. Specifically, when a thickness and the film stress of the stress liner film 204 are practically set, the ON resistance is reduced only by approximately 2% to 3%.

Figure 8:
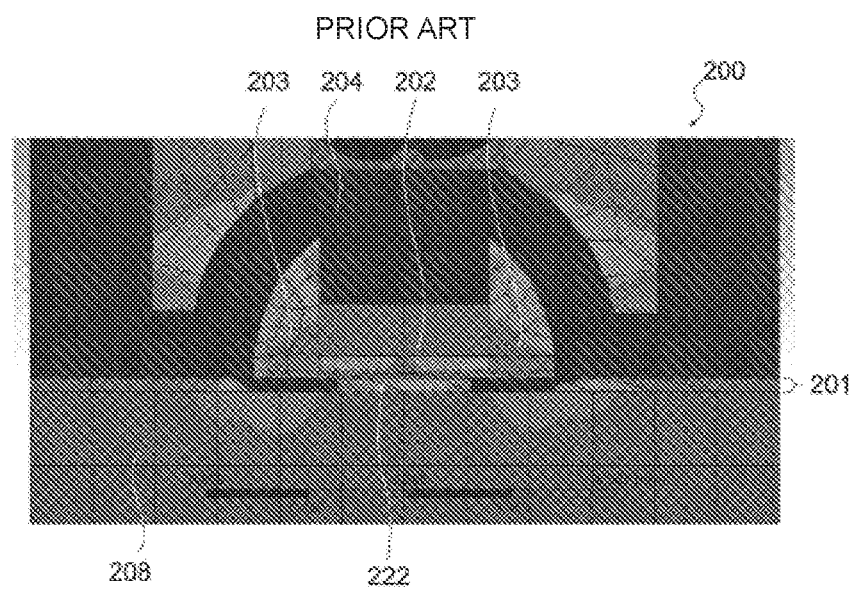
FIG. 8 A result of another simulation of the stress in the semiconductor device.

Meanwhile, when the thickness of the silicon layer 201 is reduced, the stress that is applied to the channel 222 can be increased. FIG. 8 shows a result of a stress simulation in a case where the thickness of the silicon layer 201 is set to 20 nm.

As shown in FIG. 8, when the thickness of the silicon layer 201 is reduced, the stress that is applied to the channel 222 is increased. However, when the thickness of the silicon layer 201 is reduced, diffusion resistance of the source 211 and the drain 212 is increased. Further, the source connecting layer 215 and the drain connecting layer 216 are insufficiently formed, and hence a sheet resistance is increased.

In this way, when the thickness of the silicon layer 201 is reduced, although the advantage of increasing the carrier mobility is obtained by the increased stress, the other resistive components are increased. Thus, the advantage of increasing the carrier mobility is cancelled out. As a result, the ON resistance is not reduced, but even increased.

Figure 9:
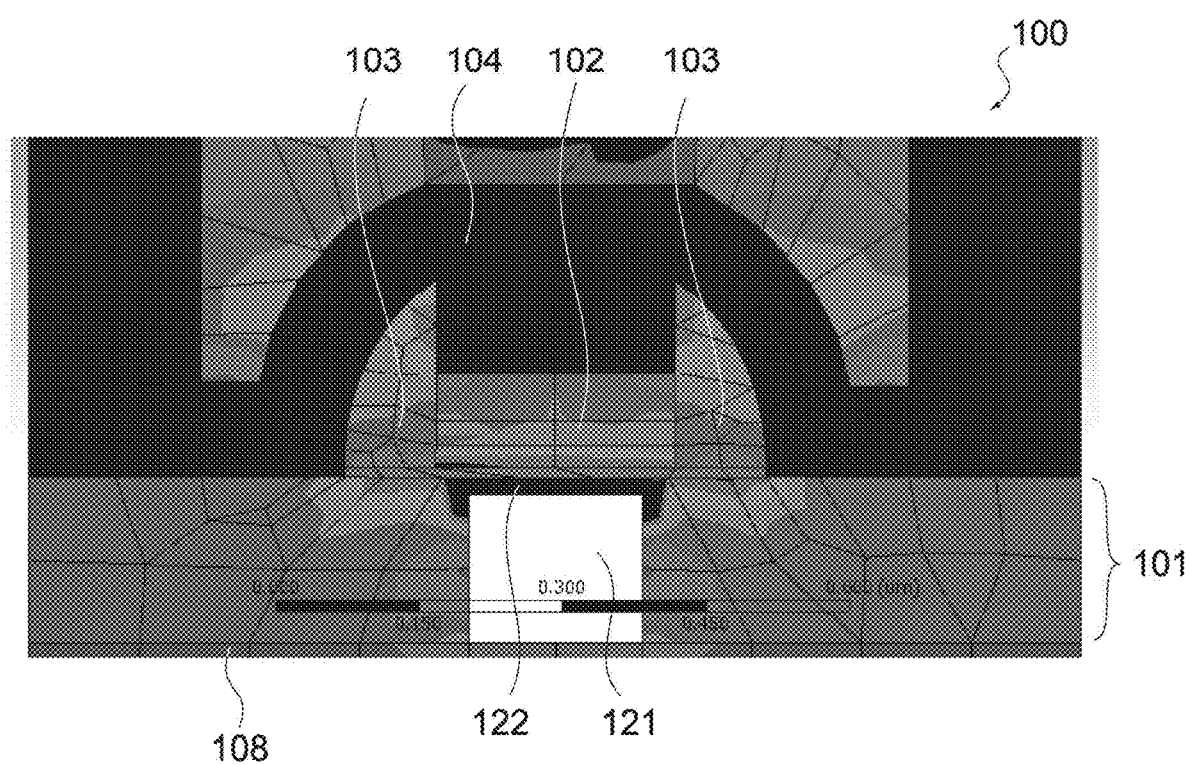
FIG. 9 A result of a simulation of the stress in the semiconductor device according to the present technology.

In contrast, in the semiconductor device 100 according to this embodiment, as described above, the hollow region 121 is provided under the channel 122. FIG. 9 shows a result of a stress simulation with respect to the semiconductor device 100, that is, visualization of a maximum principal-stress distribution. Magnitudes of the stress and color depths of regions where the stress is applied are proportionate to each other. In this simulation, the stress in a MOSTr was calculated.

As shown in FIG. 9, it is apparent that, when the hollow region 121 is provided under the channel 122, the stress concentrates on the channel 122, and the stress is applied to the entirety of the channel 122.

Figure 10:
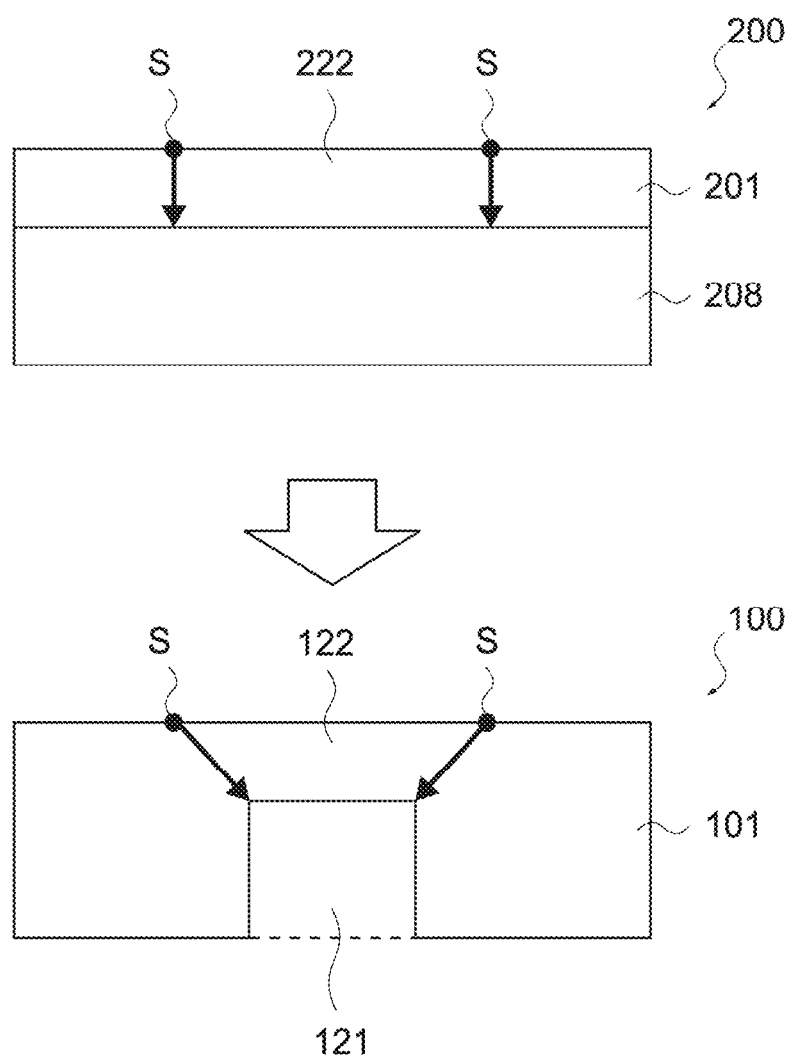
FIG. 10 A schematic view illustrating action of the hollow region in the semiconductor device.

FIG. 10 is a schematic view illustrating action of the hollow region 121, in which the stress is indicated by arrows. In the structure of the semiconductor device 200, the stress concentrates directly under the side walls 203 (as indicated by arrows S in FIG. 10). As a result, the stress disperses in the channel 222.

In contrast, in the semiconductor device 100, the stress does not concentrate directly under the side walls 103 (as indicated by the arrows S in FIG. 10), but distributes toward the hollow region 121. Thus, the stress is applied to a central part of the channel 122.

In this way, in the semiconductor device 100, owing to the provision of the hollow region 121, the stress that is applied to the channel 122 is higher than that in the semiconductor device 200. Thus, the carrier mobility is increased. As a result, the ON resistance can be reduced. Specifically, the ON resistance of the semiconductor device 100 can be reduced to be 9% lower than that of the semiconductor device 200. In addition, a breakage voltage ($BV_{ds}$) between the source 111 and the drain 112 can be improved.

Further, the thickness of the silicon layer 101 need not be reduced, and hence the diffusion resistance of the source 111 and the drain 112, and a resistance of the silicide in the source connecting layer 115 and the drain connecting layer 116 are not generated. Still further, when a volume of the hollow region 121 is set such that the body region 113 is fully depleted under a state in which the transistor is turned off, an OFF capacitance (Coff) under the OFF state also can be reduced. Specifically, the OFF capacitance in the semiconductor device 100 can be reduced to be 25% lower than that in the semiconductor device 200 (20% lower than that in the structure in which the silicon layer is formed into the thin film (refer to FIG. 8)).

[Size of Hollow Region]

Figure 11:
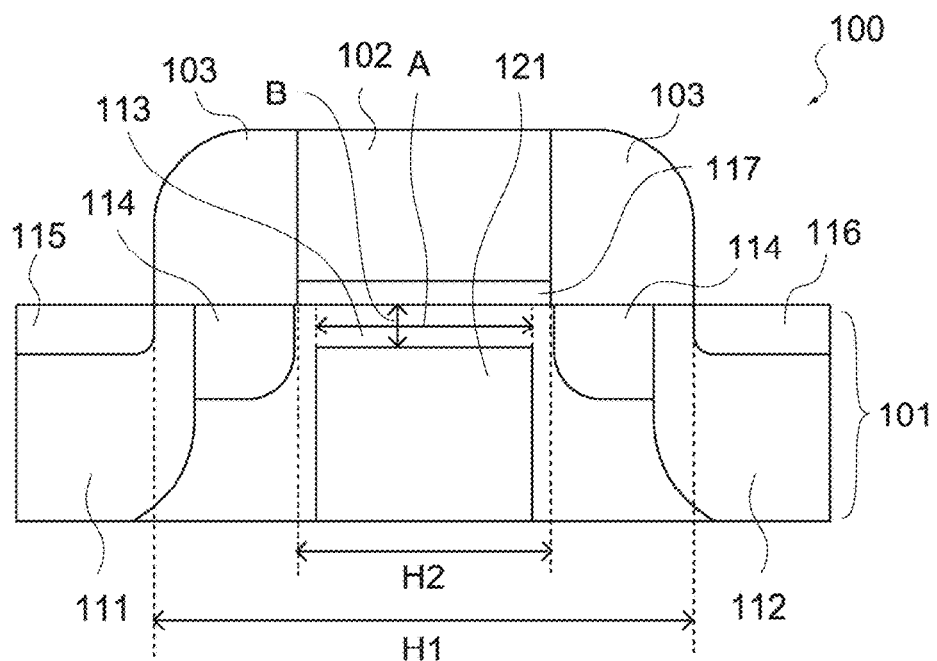
FIG. 11 A schematic view illustrating a size of the hollow region provided in the semiconductor device.

FIG. 11 is a schematic view illustrating a size of the hollow region 121. In FIG. 11, only a part of the structure of the semiconductor device 100 is illustrated. As illustrated in FIG. 11, a width (X-direction) of the upper end portion (end portion on the channel 122 side) of the hollow region 121 is defined as a width A, and a thickness (Z-direction) of the part of the silicon layer 101, which is located between the hollow region 121 and the gate insulating film 117, that is, a thickness of a part of the body region 113, which is thinned by the hollow region 121, is defined as a thickness B.

Figure 12:
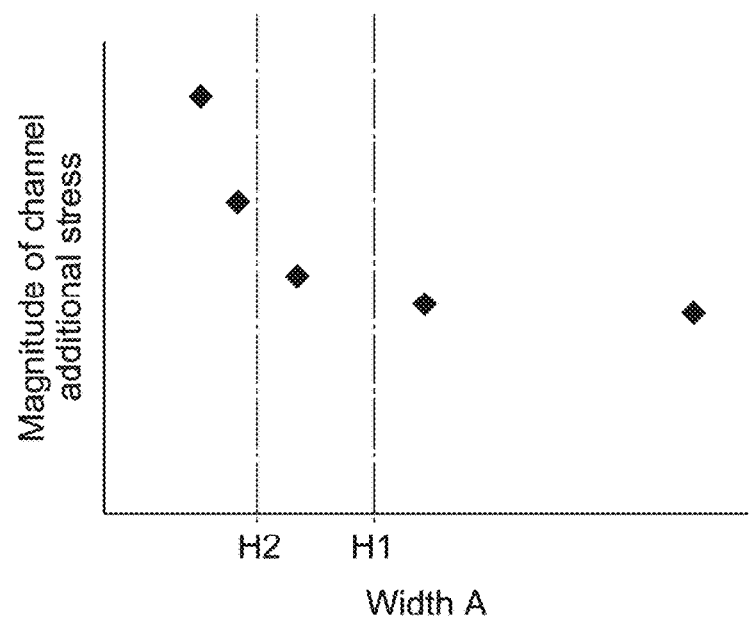
FIG. 12 A graph showing an advantage that the stress increases in accordance with a width of an upper end portion of the hollow region provided in the semiconductor device.

FIG. 12 is a graph showing a relationship between the stress that is applied to the channel 122 and the width A, specifically, showing a result of a stress simulation utilizing Ansys Workbench. The ordinate axis represents a magnitude of additional stress on the channel central portion (magnitude of channel additional stress), and the abscissa axis represents the width A. Calculations are performed on a premise that the thickness B is 20 nm. As illustrated in FIG. 11, a width H1 is a sum of the width in the X-direction of the gate 102 (gate length) and widths in the X-direction of the side walls 103, and a width H2 is the width in the X-direction of the gate 102 (gate length).

As shown in FIG. 12, it is apparent that the stress that is applied to the channel 122 becomes higher as the width A becomes smaller, and the stress sharply becomes higher as the width A becomes smaller than the width H2. Thus, the width A is preferably small, preferably smaller than the sum of the gate length and the widths of the side walls 103 (width H1), or more preferably smaller than the gate length (width H2).

Figure 13:
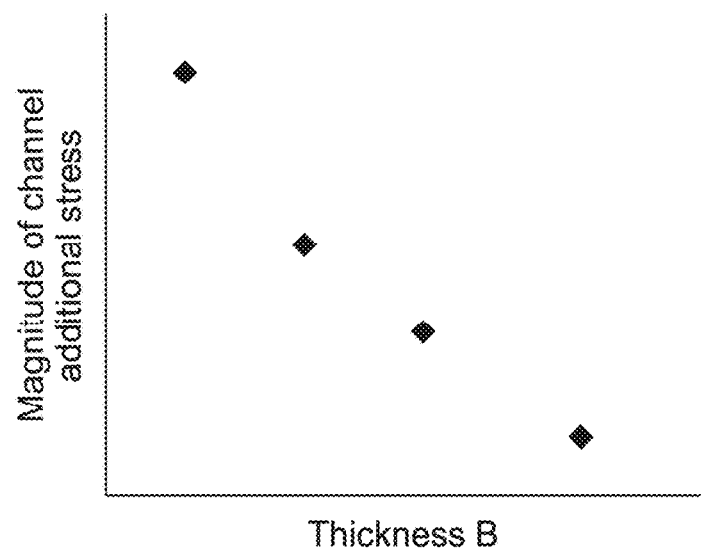
FIG. 13 A graph showing an advantage that the stress increases in accordance with a thickness of a silicon layer around the hollow region provided in the semiconductor device.

FIG. 13 is a graph showing a relationship between the stress that is applied to the channel 122 and the thickness B, specifically, showing a result of the stress simulation utilizing Ansys Workbench. The ordinate axis represents the magnitude of the additional stress on the channel central portion (magnitude of channel additional stress), and the abscissa axis represents the thickness B. Calculations are performed on a premise that the width A is 0.18 µm.

As shown in FIG. 13, it is apparent that the stress that is applied to the channel 122 becomes higher as the thickness B becomes smaller. Thus, the thickness B is preferably small. Meanwhile, as described above, the channel 122 is formed in the part of the silicon layer 101, which is between the hollow region 121 and the gate insulating film 117. Thus, the hollow region 121 needs to be provided not to hinder the carrier movement through the channel 122.

A thickness of the channel 122 is less than 10 nm, and hence the thickness B is preferably 10 nm or more. Further, when the thickness B is more than 120 nm, the advantage that the film stress that is applied to the channel 122 is increased by the hollow region 121 is reduced. Thus, the thickness B is preferably 120 nm or less. Therefore, the thickness B is preferably 10 nm or more and 120 nm or less.

The volume of the hollow region 121 is preferably high. This is because when the volume of the hollow region 121 is high, a volume of the body region 113 is low, and the body region 113 is fully depleted under the state in which the transistor is turned off.

Figure 14:
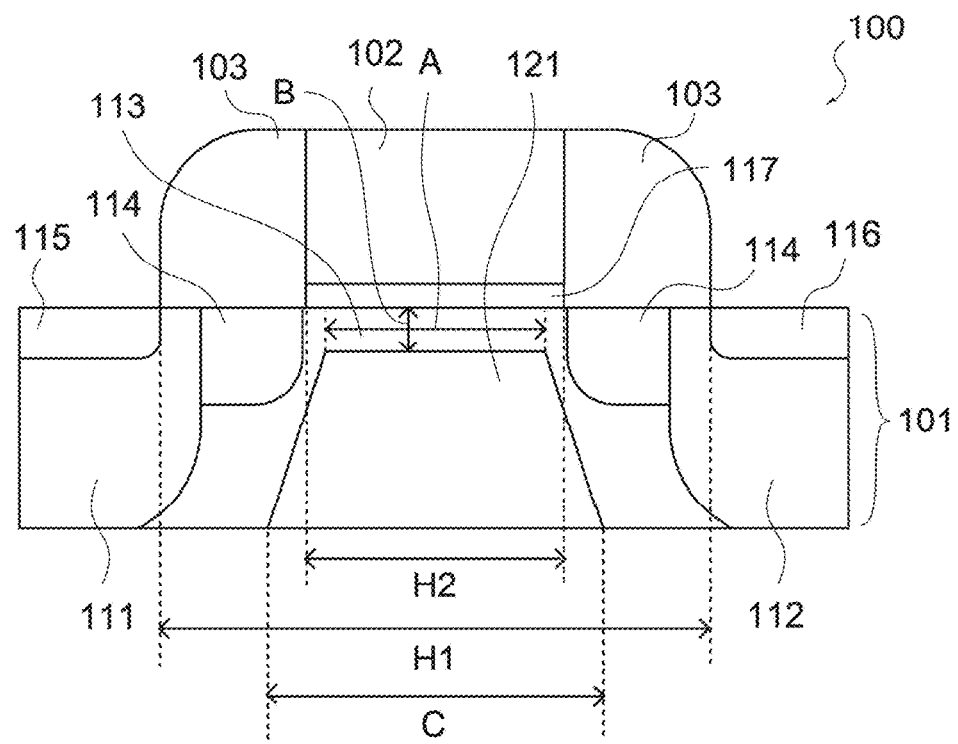
FIG. 14 A schematic view illustrating another size of the hollow region provided in the semiconductor device.

Further, the width of the upper end portion of the hollow region 121 and a width of the lower end portion of the same may be unequal to each other. FIG. 14 is a schematic view of the semiconductor device 100 including the hollow region 121 having the upper end portion and the lower end portion that are unequal to each other in width. As illustrated in FIG. 14, the width (X-direction) of the lower end portion of the hollow region 121 (end portion on a side opposite to the channel 122) is defined as a width C. As illustrated in FIG. 14, the width C may be larger than the width A, and larger than the width H2 (gate length). With this shape, the width A can be reduced, and the volume of the hollow region 121 can be increased.

[Manufacturing Methods for Semiconductor Device]

Manufacturing methods for the semiconductor device 100 are described. The semiconductor device 100 can be manufactured by the following manufacturing methods.

(First Manufacturing Method)

FIGS. 15A, 15B, 15C, and 15D are schematic views illustrating a first manufacturing method for the semiconductor device 100. As illustrated in FIG. 15A, the SOI substrate including the silicon layer 101 and the BOX layer 108 is prepared. Then, as illustrated in FIG. 15B, a resist R is laminated and patterned on the silicon layer 101.

Next, as illustrated in FIG. 15B, oxygen ions are implanted into a desired region such that an oxide layer 130 made of silicon oxide (SiO) is formed in the silicon layer 101. The oxide layer 130 is formed to have a width (X-direction) equivalent to the channel width or smaller than the channel width, and to secure the thickness of 10 nm or more and 120 nm or less from the oxide layer 130 to the surface of the silicon layer 101.

The oxide layer 130 can be formed by a SIMOX (Separation by IMplantation of Oxygen) technique. Further, although the SIMOX technique can be utilized also for the preparation of the SOI substrate (formation of the BOX layer 108), the SOI substrate may be prepared by either one of the SIMOX technique and a bonding technique.

Figure 16:
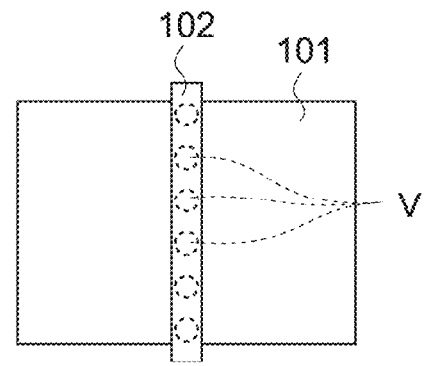
FIG. 16 A schematic view illustrating positions of holes in the first manufacturing method for the semiconductor device.

After that, as illustrated in FIG. 15C, the gate insulating film 117 and the gate 102 are formed on the silicon layer 101, and a hole V that reaches the BOX layer 108 is formed in a rear surface of the SOI substrate (surface on the side opposite to the gate 102). FIG. 16 is a view illustrating the SOI substrate as viewed from the gate 102 side. As illustrated in FIG. 16, the holes V can be provided in the rear surface of the gate 102 at equal intervals along the direction of the channel width (Y-direction).

Then, as illustrated in FIG. 15D, the BOX layer 108 and the oxide layer 130 are removed. These layers can be removed with use of etching liquid of, for example, hydrofluoric acid and ammonium fluoride. In this way, the hollow region 121 can be formed. Subsequently, the source, the gate, and the like are formed by utilizing general semiconductor processes. With this, the semiconductor device 100 can be manufactured. Note that, in this manufacturing method, the BOX layer 108 is removed, and hence the semiconductor device 100 has the SoN (silicon on nothing) structure.

When the holes V are provided at equal intervals along the direction of the channel width as described above, the BOX layer 108 and the oxide layer 130 can be uniformly removed. Further, a region where the holes V are provided and a region where the holes V are not provided may be prepared in the direction of the channel width within a single transistor. With this, a region where the hollow region 121 is provided and a region where the hollow region 121 is not provided can be formed separately from each other.

Figure 17:
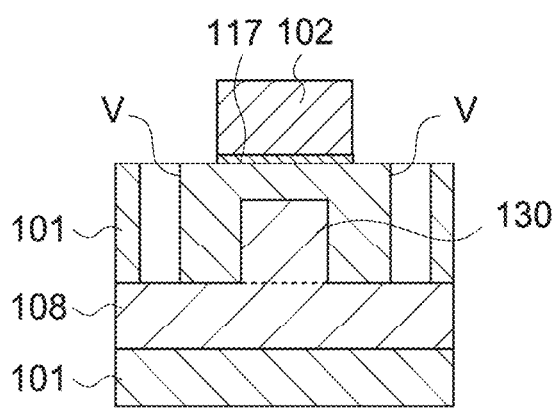
FIG. 17 A schematic view illustrating other positions of the holes in the first manufacturing method for the semiconductor device.

Note that, although the holes V are formed in the rear surface of the SOI substrate in the above-described manufacturing method, the holes V may be formed in a front surface (gate 102 side) of the SOI substrate. FIG. 17 is a schematic view illustrating the holes V formed in the front surface of the SOI substrate. As illustrated in those drawings, the holes V may be formed in the front surface of the SOI substrate, and the hollow region 121 may be formed by etching.

Further, the technique utilized in the above-described manufacturing method is not limited to the SIMOX technique. An ion-density profile may be formed by ion implantation into a region corresponding to the oxide layer 130, and then etching with use of the acid etching liquid may be performed. The hollow region 121 may be formed by removing only the high-ion-density region in this way.

(Second Manufacturing Method)

Figure 18A:
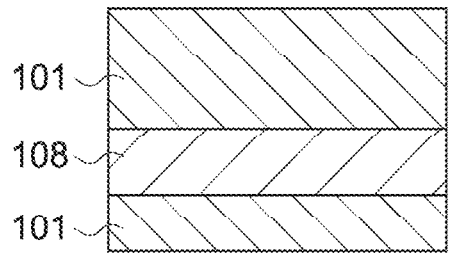
FIGS. 18A, 18B, and 18C Schematic views illustrating a second manufacturing method for the semiconductor device.
Figure 18B:
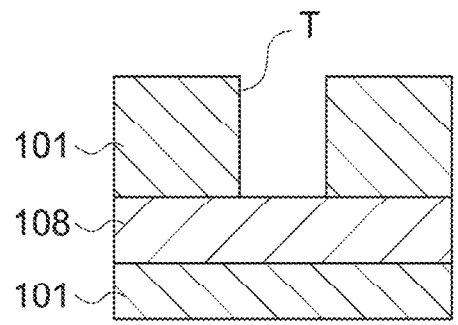
Figure 18C:
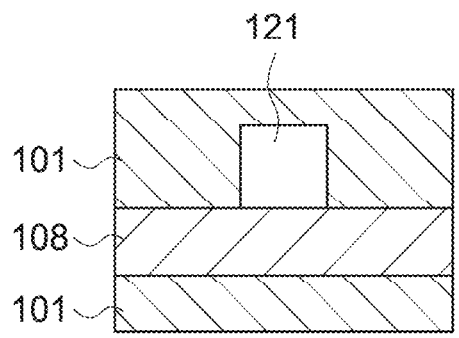

FIGS. 18A, 18B, and 18C are schematic views illustrating a second manufacturing method for the semiconductor device 100. As illustrated in FIG. 18A, the SOI substrate including the silicon layer 101 and the BOX layer 108 is prepared. Then, as illustrated in FIG. 18B, a trench T is formed. The trench T can be formed by dry etching.

Next, the SOI substrate is subjected to high-temperature annealing in a reductive atmosphere (such as a hydrogen atmosphere or a non-oxidative environment such as vacuum). A temperature of the heating may be set, for example, to 900° C. to 1000° C., and a period of the heating may be set, for example, to 5 minutes to 15 minutes.

With this, surface self-diffusion (surface migration) of silicon atoms is induced to cause spontaneous thermal deformation. With this self-assembly, an upper end portion of the trench T is closed, and a hollow structure is formed in the silicon layer 101 as illustrated in FIG. 18C. This hollow structure can be utilized as the hollow region 121. Subsequently, the source, the drain, the gate, and the like are formed by utilizing general semiconductor processes. With this, the semiconductor device 100 can be manufactured.

The trench T may include a plurality of trenches T that are provided close to each other along the channel width (Y-direction) (at intervals of 500 nm or less). With this, by fusing the plurality of trenches T with each other, the hollow region 121 can be formed to have a high volume. Further, a region where the trenches T are formed and a region where the trenches T are not formed may be provided in the direction of the channel width within a single transistor. With this, the region where the hollow region 121 is provided and the region where the hollow region 121 is not provided can be formed separately from each other.

(Third Manufacturing Method)

FIGS. 19A, 19B, and 19C are schematic views illustrating a third manufacturing method for the semiconductor device 100. As illustrated in FIG. 19A, the SOI substrate including the silicon layer 101 and the BOX layer 108 is prepared, and the SOI substrate is formed to have a transistor structure (illustration of source and drain is omitted).

Then, as illustrated in FIG. 19B, as a first stage, the silicon layer 101 and the BOX layer 108 are partially removed from the rear surface of the SOI substrate (side opposite to the gate 102). This removal can be performed by utilizing, for example, dry etching. With this, a region larger than the hollow region to be formed is removed. This etching need not be performed with high accuracy, and may be performed somewhat roughly and at high speed.

Next, as illustrated in FIG. 19C, as a second stage, the BOX layer 108 and the silicon layer 101 are removed. This removal, which can be performed, for example, by utilizing dry etching, is performed with accuracy higher than that in the first stage. The BOX layer 108 can be utilized as an etching stopper, and hence the etching can be performed at high speed and with high accuracy.

(Other Manufacturing Methods)

The semiconductor device 100 can be manufactured by manufacturing methods other than the above-described manufacturing methods. For example, there may be utilized a manufacturing method including utilizing a coverage at which the hollow region 121 is formed of a gap that is intentionally formed at a time of refilling the trench by epitaxial growth of silicon, the trench having been formed from the surface of the silicon layer 101 preceding the preparation of the transistor.

[Shape of Hollow Region]

The hollow region 121 need not necessarily to have a rectangular shape in cross-section as described above as long as the thickness of the part of the silicon layer 101, which is between the hollow region 121 and the gate insulating film 117, is larger than the thickness of the channel 122. In consideration of promotion of the depletion under the state in which the transistor is turned off, that is, in consideration of the reduction of the OFF capacitance, a ratio of the volume of the hollow region 121 is preferably higher than that of the body region 131.

FIGS. 20A, 20B, 20C, 20D, and 20E are schematic views illustrating various shapes of the hollow region 121. The hollow region 121 may have a trapezoidal shape in which, as illustrated in FIG. 20A, the width of the upper end portion is small and the width of the lower end portion is large, a triangular shape as illustrated in FIG. 20B, a polygonal shape as illustrated in FIG. 20C, or a non-angular round droplet shape as illustrated in FIG. 20D. Alternatively, as illustrated in FIG. 20E, the semiconductor device 100 may include a plurality of hollow regions 121. With any of these shape, by providing the hollow region 121, the stress that is applied to the channel 122 can be increased.

[Insulating Region]

Figure 21:
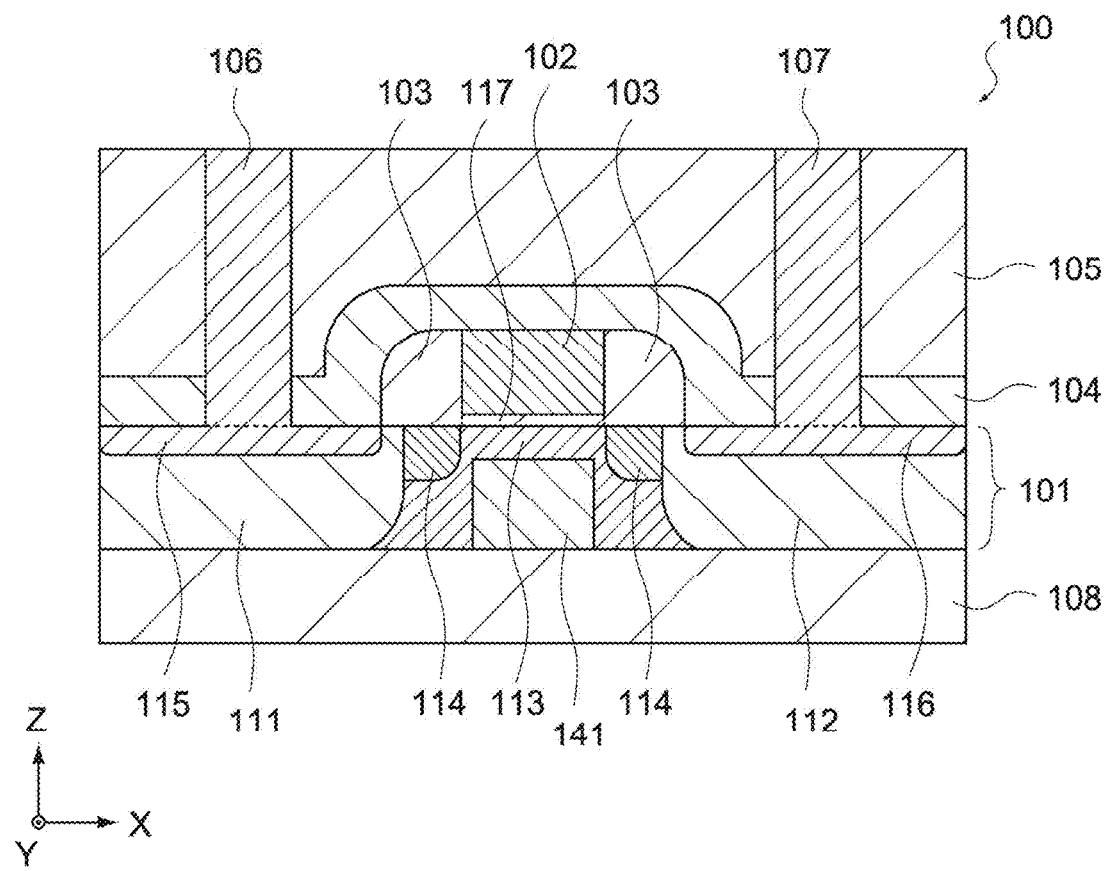
FIG. 21 A cross-sectional view of a semiconductor device according to the embodiment of the present technology, which includes an insulating region.

The semiconductor device 100 may include an insulating region instead of the hollow region 121 in the description hereinabove. FIG. 21 is a schematic view of a semiconductor device 300 including an insulating region 141. Configuration features other than the insulating region 141 are the same as those of the semiconductor device 100, and hence description thereof is omitted.

The insulating region 141 may be formed by filling the inside of the above-described hollow region 121 with an insulating material. As examples of the insulating material includes SiO2 and a synthetic resin. Further, when the insulating material has film stress, a structure in which the film stress is applied to the channel 122 not only by the stress liner film 104 but also by the insulating region 141 can be provided.

Figure 22:
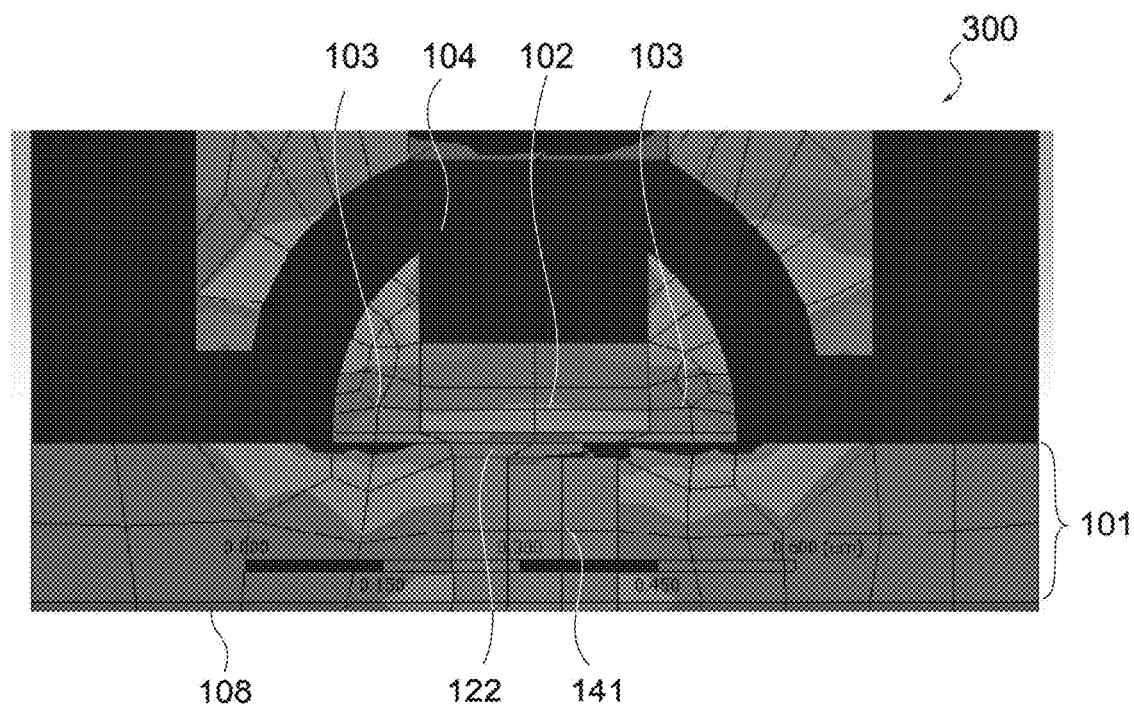
FIG. 22 A result of a simulation of the stress in the semiconductor device.

FIG. 22 shows a result of a stress simulation with respect to the semiconductor device 300, that is, visualization of a maximum principal-stress distribution. Magnitudes of the stress and darkness levels of colors of regions where the stress is applied are proportionate to each other. In this simulation, the stress in a MOSTr was calculated.

As shown in FIG. 22, it is apparent that, when the insulating region 141 is provided under the channel 122, the stress concentrates on the channel 122, and the stress is applied to the entirety of the channel 122.

A width of an upper end portion of the insulating region 141 corresponds to the width A of the upper end portion of the hollow region 121, and a thickness of a part of the silicon layer 101, which is between the insulating region 141 and the gate insulating film 117, corresponds to the thickness of the part of the silicon layer 101, which is between the hollow region 121 and the gate insulating film 117 (refer to FIG. 11).

Figure 23:
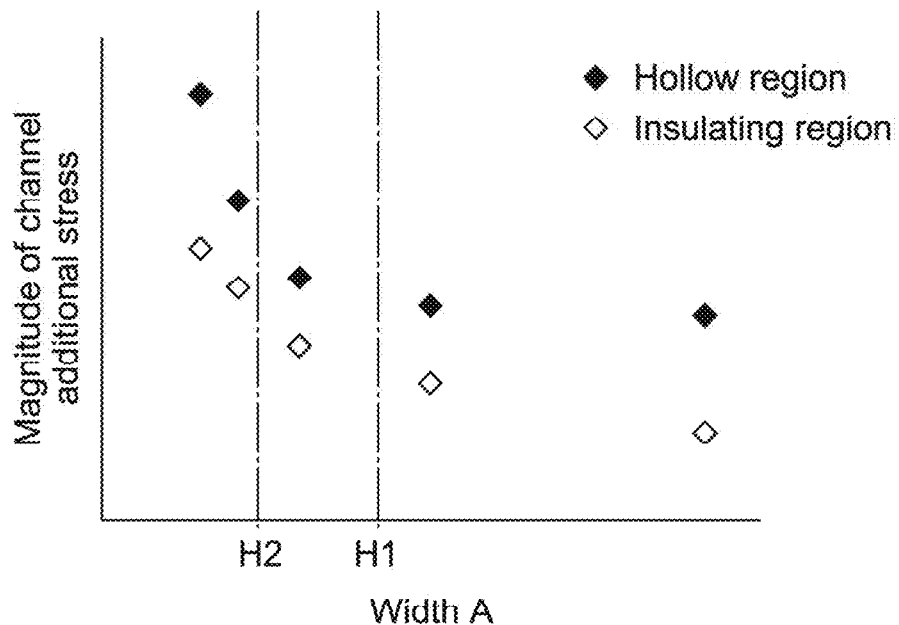
FIG. 23 A graph showing an advantage that the stress increases in accordance with widths of upper end portions of the hollow region provided in the semiconductor device.

FIG. 23 is a graph showing relationships between the stress that is applied to the channel 122 and the width A, specifically, showing results of a stress simulation utilizing Ansys Workbench. The result from the structure in which the hollow region 121 is provided and a result from the structure in which the insulating region 141 is provided are shown together.

The ordinate axis represents the magnitude of the additional half stress on the channel central portion (magnitude of channel additional stress), and the abscissa axis represents the width A. Calculations are performed on the premise that the thickness B is 20 nm. As illustrated in FIG. 11, the width H1 is the sum of the width of the gate 102 (gate length) and the widths of the side walls 103, and the width H2 is the width of the gate 102.

As shown in FIG. 23, it is apparent that the stress that is applied to the channel 122 becomes higher as the width A becomes smaller, and the stress sharply becomes higher as the width becomes smaller than the width H2. Thus, the width A is preferably small, or more preferably smaller than the gate length (width H2). Further, the stress that is applied to the channel 122 in the case of the insulating region 141 is smaller than that in the case of the hollow region 121.

Figure 24:
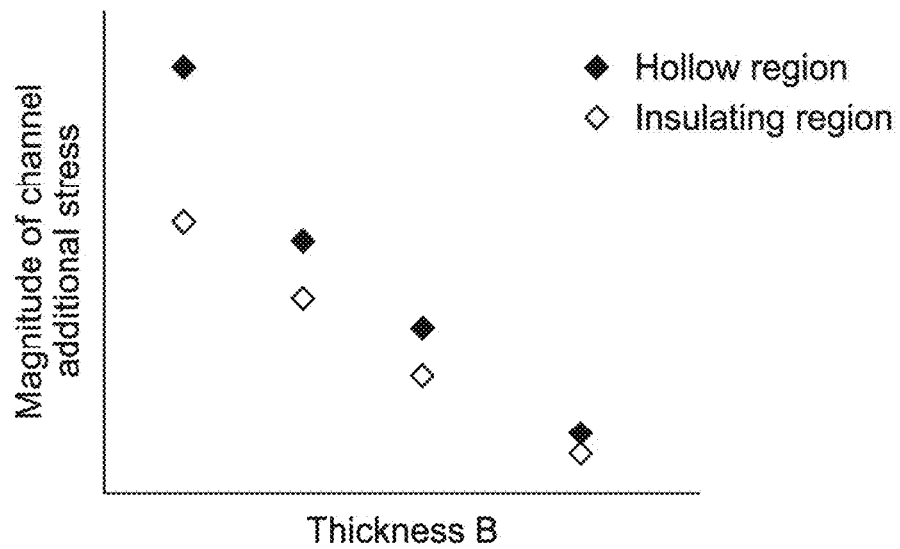
FIG. 24 A graph showing an advantage that the stress increases in accordance with thicknesses of the silicon layer around the hollow region provided in the semiconductor device.

FIG. 24 is a graph showing relationships between the stress that is applied to the channel 122 and the thickness B, specifically, showing results of the stress simulation utilizing Ansys Workbench. The result from the structure in which the hollow region 121 is provided and a result from the structure in which the insulating region 141 is provided are shown together. The ordinate axis represents the magnitude of the additional stress on the channel central portion (magnitude of channel additional stress), and the abscissa axis represents the thickness B. Calculations are performed on the premise that the width A is 0.18 μm.

As shown in FIG. 24, it is apparent that the stress that is applied to the channel 122 becomes higher as the thickness B becomes smaller. Thus, the thickness B is preferably small. Meanwhile, as described above, the channel 122 is formed in the part of the silicon layer 101, which is between the hollow region 121 and the gate 102. Thus, the hollow region 121 needs to be provided not to hinder the carrier movement through the channel 122. For these reasons, the thickness B is preferably 10 nm or more and 100 nm or less. Further, the stress that is applied to the channel 122 in the case of the insulating region 141 is smaller than that in the case of the hollow region 121.

The semiconductor device 300 can be manufactured by manufacturing the semiconductor device 100 by the above-described manufacturing methods, and then embedding the insulating material into the hollow region 121 formed during the manufacture. For example, after etching is performed from the rear surface of the SOI substrate in the third manufacturing method (refer to FIGS. 19A, 19B, and 19C), the insulating material can be embedded from the rear surface. Alternatively, silicon oxide formed in the silicon layer by utilizing the SIMOX technique may be used as the insulating region 141.

[Use Applications of Semiconductor Devices]

The semiconductor device 100 and the semiconductor device 300 having the above-described structures can constitute a CMOS (Complementary MOS) circuit in which the NMOS and the PMOS are complementarily arranged. Further, the semiconductor device 100 and the semiconductor device 300 can be installed in electronic apparatuses. The semiconductor device 100 and the semiconductor device 300 have satisfactory electric characteristics of being low in ON resistance and low in OFF capacitance, and hence are capable of increasing performance of the CMOS circuit and the electronic apparatuses.

Note that, the present technology may also provide the following configurations.

(1)

A semiconductor device including
a transistor including
a source of a first semiconductor type,
a drain of the first semiconductor type, and
a body region of a second semiconductor type, the body region being provided between the source and the drain, the semiconductor device including
a hollow region or an insulating region provided under a channel that is formed between the source and the drain in the body region.

(2)

The semiconductor device according to Item (1), further including
a stress liner film that applies film stress to the channel.

(3)

The semiconductor device according to Item (1) or (2), further including:
a gate insulating film;
a gate that faces the body region through intermediation of the gate insulating film; and
side walls adjacent to the gate, in which a width in a first direction parallel to a channel length of an end portion on the channel side of the hollow region or the insulating region is smaller than a sum of a gate length and widths in the first direction of the side walls.

(4)

The semiconductor device according to Item (3), in which the width in the first direction of the end portion on the channel side of the hollow region or the insulating region is smaller than the gate length.

(5)

The semiconductor device according to Item (4), in which a width in the first direction of an end portion on a side opposite to the channel side of the hollow region or the insulating region is larger than the gate length.

(6)

The semiconductor device according to any one of Items (1) to (5), in which
the hollow region or the insulating region is formed such that a thickness of a part of the body region, the part being thinned by the hollow region or the insulating region, is 10 nm or more and 120 nm or less.

(7)

The semiconductor device according to any one of Items (1) to (6), in which
the hollow region or the insulating region has a volume at which the body region is fully depleted under a state in which the transistor is turned off.

(8)

The semiconductor device according to any one of Items (2) to (7), in which
the semiconductor device is an NMOS (N-type Metal Oxide Semiconductor) in which the first semiconductor type is an N-type and the second semiconductor type is a P-type, and
the stress liner film applies tensile film stress to the channel.

(9)

The semiconductor device according to any one of Items (2) to (7), in which
the semiconductor device is a PMOS (P-type Metal Oxide Semiconductor) in which the first semiconductor type is a P-type and the second semiconductor type is an N-type, and
the stress liner film applies compressive film stress to the channel.

(10)

The semiconductor device according to any one of Items (1) to (9), in which
the semiconductor device has
an SOI structure, or
an SoN structure.

(11)

The semiconductor device according to any one of Items (1) to (9), in which
the semiconductor device is a MOSFET (Metal Oxide Semiconductor Field Effect Transistor).

(12)

The semiconductor device according to any one of Items (1) to (11), in which
the stress liner film is made of silicon nitride, and
the insulating region is made of silicon oxide.

(13)

The semiconductor device according to any one of Items (1) to (12), in which
the insulating region applies film stress to the channel.

(14)

A CMOS (Complementary MOS) circuit, including
a semiconductor device including
a transistor including
a source of a first semiconductor type,
a drain of the first semiconductor type, and
a body region of a second semiconductor type, the body region being provided between the source and the drain, the semiconductor device including
a hollow region or an insulating region provided under a channel that is formed between the source and the drain in the body region.

(15)

An electronic apparatus, including
a semiconductor device including
a transistor including
a source of a first semiconductor type,
a drain of the first semiconductor type, and
a body region of a second semiconductor type, the body region being provided between the source and the drain, the semiconductor device including
a hollow region or an insulating region provided under a channel that is formed between the source and the drain in the body region.

REFERENCE SIGNS LIST 100 semiconductor device
101 silicon layer
102 gate
103 side wall
104 stress liner film
111 source
112 drain
113 body region
114 lightly doped drain
121 hollow region
122 channel
141 insulating region

The invention claimed is:

1. A semiconductor device, comprising:
a transistor including
a source of a first semiconductor type,
a drain of the first semiconductor type, and
a body region of a second semiconductor type,
wherein the body region is between the source and the drain; and
one of a hollow region or an insulating region below a channel, wherein
the channel is between the source and the drain in the body region, and
the channel is different from both the source and the drain in the body region.

2. The semiconductor device according to claim 1, further comprising a stress liner film configured to apply film stress to the channel.

3. The semiconductor device according to claim 2, wherein
the semiconductor device is an N type Metal Oxide Semiconductor (NMOS) in which the first semiconductor type is an N-type and the second semiconductor type is a P-type, and
the stress liner film is further configured to apply tensile film stress to the channel.

4. The semiconductor device according to claim 2, wherein
the semiconductor device is a P type Metal Oxide Semiconductor (PMOS) in which the first semiconductor type is a P-type and the second semiconductor type is an N-type, and the stress liner film is further configured to apply compressive film stress to the channel.

5. The semiconductor device according to claim 2, wherein
the stress liner film comprises silicon nitride, and
the insulating region comprises silicon oxide.

6. The semiconductor device according to claim 1, further comprising:
a gate insulating film;
a gate that faces the body region through intermediation of the gate insulating film; and
a plurality of side walls adjacent to the gate, wherein
a first width in a first direction parallel to a channel length of an end portion on a channel side of the one of the hollow region or the insulating region is smaller than a sum of a gate length and a plurality of widths in the first direction of the plurality of the side walls.

7. The semiconductor device according to claim 6, wherein the first width in the first direction of the end portion on the channel side of the one of the hollow region or the insulating region is smaller than the gate length.

8. The semiconductor device according to claim 7, wherein a second width in the first direction of an end portion on a side opposite to the channel side of the hollow region or the insulating region is larger than the gate length.

9. The semiconductor device according to claim 1, wherein
a thickness of a part of the body region is 10 nm or more and 120 nm or less, and
the part is thinned by the one of the hollow region or the insulating region.

10. The semiconductor device according to claim 1, wherein the one of the hollow region or the insulating region has a volume at which the body region is fully depleted under a state in which the transistor is turned off.

11. The semiconductor device according to claim 1, wherein the semiconductor device has one of a silicon on insulator (SOI) structure or a silicon on nothing (SoN) structure.

12. The semiconductor device according to claim 1, wherein the semiconductor device is a Metal Oxide Semiconductor Field Effect Transistor (MOSFET).

13. The semiconductor device according to claim 1, wherein the insulating region is configured to apply film stress to the channel.

14. A Complementary Metal Oxide Semiconductor (CMOS) circuit, comprising
a semiconductor device including
a transistor including
a source of a first semiconductor type,
a drain of the first semiconductor type, and
a body region of a second semiconductor type,
wherein the body region is between the source and the drain; and
one of a hollow region or an insulating region below a channel, wherein
the channel is between the source and the drain in the body region, and
the channel is different from both the source and the drain in the body region.

15. An electronic apparatus, comprising:
a semiconductor device including
a transistor including
a source of a first semiconductor type,
a drain of the first semiconductor type, and
a body region of a second semiconductor type,
wherein the body region being is between the source and the drain; and
one of a hollow region or an insulating region below a channel, wherein
the channel is between the source and the drain in the body region, and
the channel is different from both the source and the drain in the body region.

* * * * *